United States Patent [19]

Magdo

[11] 3,936,856

[45] Feb. 3, 1976

[54] SPACE-CHARGE-LIMITED INTEGRATED CIRCUIT STRUCTURE

[75] Inventor: Steven Magdo, Hopewell Junction, N.Y.

[73] Assignee: International Business Machines Corporation, Armonk, N.Y.

[22] Filed: May 28, 1974

[21] Appl. No.: 473,650

[52] U.S. Cl. .................... 357/21; 357/20; 357/22; 357/35; 357/41; 357/48; 357/58
[51] Int. Cl.² ........................................ H01L 29/74
[58] Field of Search ............. 357/21, 22, 35, 40, 41, 357/48, 51, 58, 20

[56] References Cited
UNITED STATES PATENTS

| | | | |
|---|---|---|---|
| 3,275,911 | 9/1966 | Onondera .............................. | 357/86 |
| 3,396,317 | 8/1968 | Vendelin ............................... | 357/89 |
| 3,493,824 | 2/1970 | Richman et al ....................... | 357/58 |
| 3,569,800 | 3/1971 | Collins ................................... | 357/58 |
| 3,591,840 | 7/1971 | Glinski .................................. | 357/89 |
| 3,614,555 | 10/1971 | Glinski .................................. | 357/89 |
| 3,688,132 | 8/1972 | Gill et al. .............................. | 357/48 |
| 3,840,886 | 10/1974 | Ashar et al. .......................... | 357/21 |

OTHER PUBLICATIONS

L. Clark, "Now, New Unijunction Geometries," Electronics, June 14, 1965, pp. 93–97.
V. Glinski, "A Three Mask Bipolar Integrated Circuit Structure," IEEE Trans. on E.D., Vol. ED-19, No. 2, Feb. 1972, pp. 182–190.
R. Cushman, "Tube-Like Transistor Promises Best-Yet Speed-Power," EDN, Sept. 5, 1973, pp. 18–20.
S. Magdo, "Theory and Operation of Space-Charge-Limited Tran. S. with Transverse Injection," IBM J. of R. & D., Vol. 17, No. 5, Sept. 1973, pp. 443–458.

Primary Examiner—Andrew J. James
Assistant Examiner—Joseph E. Clawson, Jr.
Attorney, Agent, or Firm—Thomas F. Galvin

[57] ABSTRACT

A space-charge-limited integrated circuit structure featuring optimized geometry to allow maximum packing density of the transistors in a semiconductor substrate.

The widths of any two isolated regions of the same conductivity type are established in relation to the width of the region separating the isolated regions. The width of the region which separates two isolated regions having the same conductivity type as the high resistivity substrate must be greater than 0.75 times the width of either of the isolated regions. Conversely, the width of the region which separates the isolated regions having the opposite conductivity type to the substrate must be greater than 0.25 times the width of either of the isolated regions.

10 Claims, 8 Drawing Figures

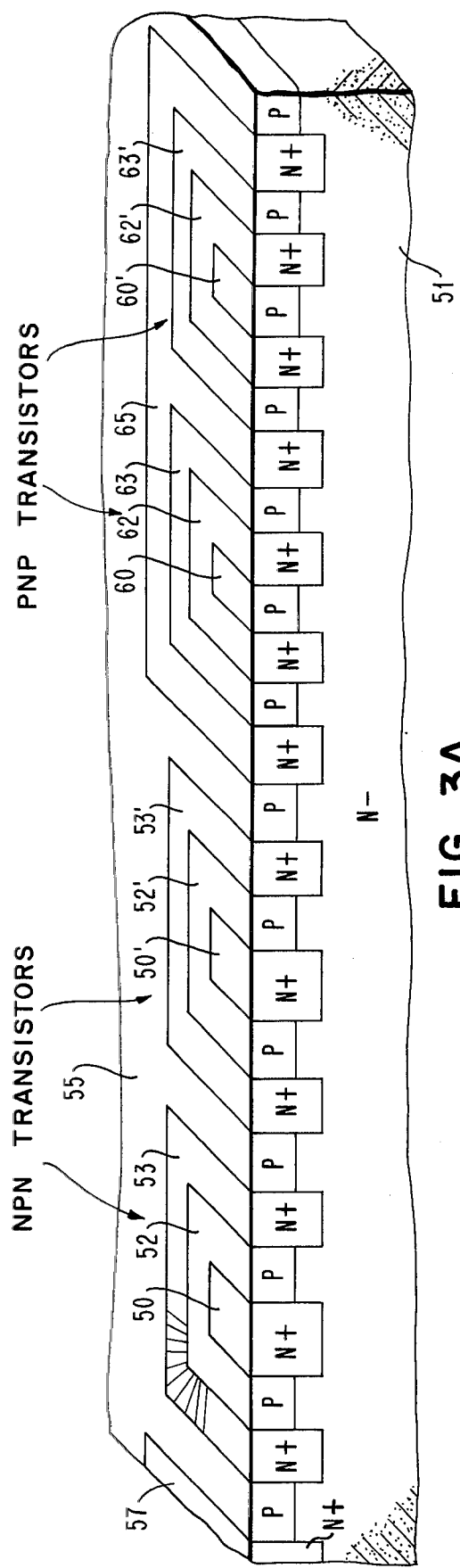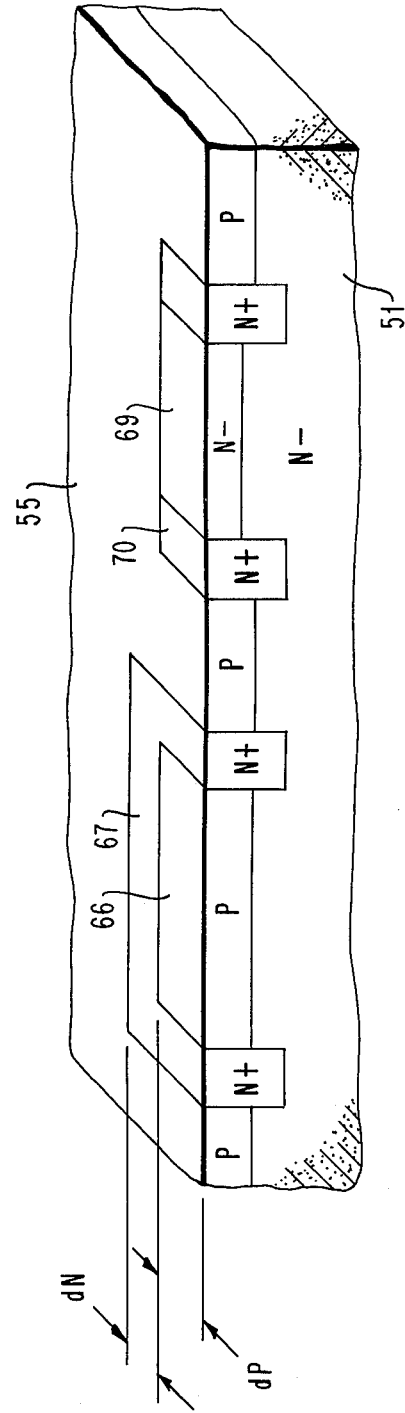

SPACE-CHARGE-LIMITED INTEGRATED CIRCUIT STRUCTURE

CROSS-REFERENCE TO A RELATED APPLICATION

This application is related to copending application, Ser. No. 209,233, now U.S. Pat. No. 3,840,886 filed Dec. 17, 1971, in the names of Kanu Ashar et al for "Microampere Space-Charge-Limited Transistor," and assigned to the same assignee as the present application.

This application is also related to copending application, Ser. No. 428,165, now U.S. Pat. No. 3,855,609 filed Dec. 26, 1973, in the names of I. E. Magdo et al, for "Space-Charge-Limited Transistor Having Recessed Dielectric Isolation," also assigned to the present assignee.

FIELD OF THE INVENTION

The present invention relates to space-charge-limited transistor integrated circuits. More particularly, it relates to optimizing the geometrical design of such transistors when fabricated within semiconductor substrates.

DESCRIPTION OF THE PRIOR ART

The above-referenced application by Ashar et al describes the basic space-charge-limited transistor, which essentially comprises a pair of lateral transistors formed in overlying relationship in a high resistivity substrate. The lower transistor is the lateral space-charge-limited transistor while the upper transistor is a parasitic lateral bipolar transistor. At zero base-emitter bias, both transistors are cut off. As the base-emitter junction becomes increasingly forward-biased, space-charge-limited current is initiated first in the lower transistor. As the forward bias increases to higher values, bipolar transistor action is also initiated in the upper transistor.

As discussed in the aforementioned Magdo et al. copending patent application, Ser. No. 428,165, complementary space-charge-limited (SCL) transistors are very attractive for large-scale integration. They can be fabricated with a minimum of processing steps, resulting in a consequent high yield; and they consume low power, resulting in the possibility of a high packing density within the semiconductor substrate.

The SCL integrated circuit comprises separated regions of opposite conductivity type diffused into a high resistivity substrate of one conductivity type, e.g. N-, the resistivity being greater than 10,000 ohm-cm. The regions of said one conductivity type, e.g., N regions, preferably have a higher doping level and larger diffusion depth than the P regions. The N regions form the emitters and collectors of the NPN and the base of the PNP transistors; the P regions form the emitters and collectors of the PNP and the base of the NPN transistors. The N+ regions are separated laterally and isolated thereby from each other electrically by surrounding P regions and vice versa. Both the N+ and P regions are separated vertically and thus isolated from each other by the high resistivity substrate. This high resistivity isolation afforded by the substrate is significantly different from the conventional junction isolation of prior art transistors. The dielectric relaxation time in the regions of the high resistivity substrate between regions of the same conductivity type is much larger than the carrier transit time.

In the design of integrated circuits with SCL transistors, it is very important to reduce the separation between two isolated regions of the same impurity type for two reasons.

First, the smaller the separation between two isolated regions, e.g. collectors, the closer two adjacent transistors can be moved to each other, thus increasing packing density.

Second, because the emitter and collector of an individual transistor are isolated from each other in the same way as to adjacent collectors of two transistors, the minimum separation between two insolated regions also determines the minimum base width of the transistor. From the integrated circuit point of view, the base width should be as small as possible to increase circuit performance.

My first experimental results with integrated circuits using SCL transistors revealed that the leakage current became excessive and sometimes uncontrollable if the separation between two isolated regions of the same impurity type was reduced to about 5 micrometers ($\mu$m) or below. Also, if a sharp corner were present in the horizontal geometry of at least one of the two isolated regions, the leakage current could become excessive even if the separation were larger than 5 $\mu$m. This minimum separation between isolated regions would, of course, impose a severe limitation of the use of SCL transistors in integrated circuits. For example, it is now possible to obtain line widths of around 2.5 $\mu$m by photolithographic processing; and the advent of electron beam techniques portend line widths of below 1 $\mu$m.

SUMMARY OF THE INVENTION

It is therefore an object of my invention to increase the packing density and performance of space-charge-limited transistors which may be fabricated within a semiconductor substrate.

I have determined experimentally and theoretically the isolated model of SCL transistor integrated circuits and have been able to reduce the minimum separation between two isolated regions. The isolation is entirely different from the junction isolated found in transistors formed in lower resistivity substances. Close to the surface of the substrate, both N and P regions are isolated from each other laterally with junction isolation employing metallurgical junctions. Deep in the substrate, the isolation is achieved with electrical junctions which join the metallurgical junctions in the vertical direction. The electrical junctions are created in the high resistivity substrate by the hole and electron clouds diffused respectively from the P and N+ type impurity regions above. I have found that high resistivity vertical channels, separated by electrical junctions, are formed in the substrate below the different type of impurity regions. The resulting isolation resistance is an order of magnitude higher than that resulting from the spreading resistance of the high resistivity substrate, typically 30K ohm-cm. Test data taken from actual SCL devices verify the isolated model. The typical isolation resistance between adjacent collectors is 200 – 300 × $10^6$ ohms.

As a result, I have been able to scale down the size of SCL integrated circuits substantially. For example, based on the present state of the art of photolithography, both the separation betweeen adjacent transistors, as well as the base widths of the transistors, can be reduced to about 0.1 mil (2.5 μm). The minimum device areas of NPN and a PNP transistor, assuming a N-substrate, is 0.9 mil² (570μm²) and 1.43 mil² (900μm²), respectively.

The minimum isolation distance between any highly doped N+ regions, assuming a N-substrate, is related to the size of said regions by the following formula:

$$dP/dN \geq 0.75 \qquad (1)$$

where
- $dP$ is defined as the lateral width of the P region between the highly doped N+ regions; and
- $dN$ is the lateral width of the highly doped regions themselves.

In addition, the minimum isolation width of the N+ region between any P regions is given by the formula:

$$dN/dP \geq 0.25 \qquad (2)$$

Combining formulas (1) and (2) =
$$0.75 \leq dP/dN \leq 4.0 \qquad (3)$$

In a practical integrated SCL transistor structure, formulas (1) and (2) serve to specify the isolation distance between transistors as well as the isolation between the emitter and collector of an individual transistor.

Devices complementary to those described herein are also achievable upon the substitution of P− substrate for the indicated N= substrate, together with a reversal of the operating potentials. FIG. 1 illustrates a general model of my invention.

FIGS. 3a and 3b illustrate a portion of an SCL integrated circuit.

DESCRIPTION OF THE PREFERRED EMBODIMENT

Figure 1:
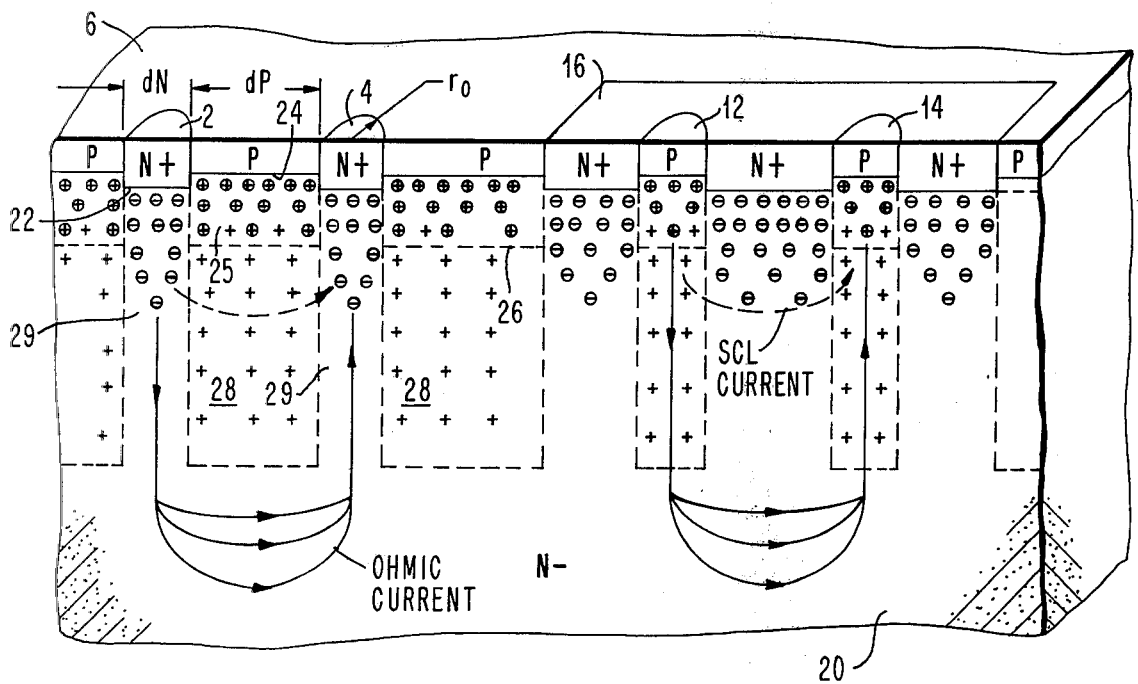

FIG. 1 illustrates a general model of my invention where N+ type regions are separated by P type regions and vice versa. Thus, N+ regions 2 and 4 are separated by P region 6; and P regions 12 and 14 are separated by N+ region 16.

As described in copending application, Ser. No. 209,233, the SCL transistor features an N type substrate 20 having a resistivity greater than 10,000 ohm-cm into which the active regions described above are diffused. The N+ regions 2, 4 and 16 have a higher doping level and larger diffusion depth than P regions 6, 12 and 14. The N+ regions are separated laterally and isolated from one another electrically by the surrounding P regions; conversely, the P regions are separated laterally by the surrounding N+ regions. Both N+ and P regions are separated vertically and are isolated from each other by high resistivity substrate 20.

As described in copending application, Ser. No. 209,233, the N+ pockets form horizontal high-low junctions 22 with substrate 20 ($N_H/N_L$). The high-doped side has a positively charged, partically depleted region (not shown). Electrons diffuse from this region to the low-doped side to form an electron cloud. The depth of the cloud is about $3 \times L_{DE}$, where $L_{DE}$ is the extrinsic Debye length of the low-doped side. This depth is practically independent of the doping level of the high-doped side. The edge of the electron cloud is defined as that location with a diffused electron density of 10% above the impurity atom density. The density of the electron cloud decreases very rapidly with distance away from the high-low junction as decribed in copending application, Ser. No. 428,165. At a distance of about $0.5L_{DE}$, the free electron density is only an order of magnitude higher than its thermal equilibrium value. This distance is defined as the effective depth, $L_{eff}$, of the electron cloud.

The P pockets form horizontal, asymmetric $P/N_L$ junctions 24 with the substrate. The P sides of these junctions have negatively charged, partically depleted, regions (not shown). On the $N_L$ side is a diffused hole cloud 25. This is followed by a positively charged, partially depleted region 28. The electrical junction 26 is formed where $n = p = n_i$.

In actual devices fabricated in accordance with the present invention, the displacement of electrical junction 26 from junction 24 is about 1.5 $L_{DE}$, or 13 microns for a 30KΩ cm substrate. This displacement is dependent in a practical sense only upon the doping level of N− substrate 20, assuming that the doping level ratio $P/N_L$ is greater that $10^5$. The depth of depleted region 28 below hole cloud 225 is about 70 μm from the metallurgical P-$N_L$ junction 24 at zero volts bias. The density of the hole cloud decreases very rapidly with distance away from the metallurgical junction as described in the copending application, Ser. No. 428,165. At a distance of about 0.5 $L_{DE}$, the free hole density drops down to the impurity atom density of the substrate. This distance is defined as the effective depth, $L_{eff}$, of the hole cloud.

Both the conduction and valence bands in the electron-depleted (hole-diffused) regions 28 and electron-deffused regions 29 shift toward the P and N levels, respectively. Thus, vertical conductive channels, horizontally separated by a potential step, form below both the N+ and P portions of the substrate. If a small forward bias voltage is applied either between separated N+ regions 2 and 4 or P regions 12 and 14, leakage current path is confined to the conductive channels 29 and 28 and spreads out in N− substrate 20. This current is denoted in FIG. 1 as ohmic current. In addition, with increasing voltage, an increasing amount of space-charge-limited current (SCL) flows across the depleted regions between the channels. The current is denoted as SCL current in FIG. 1 and is negligible.

The channel isolation structure just described appears only if the substrate conductivity type is the same as the conductivity type of the highly doped and deeply diffused regions; in the preferred embodiment these are N type. Alternatively, substrate 20 could be P− and the highly doped, deeply diffused regions could be P+. However, if the conductivity were P− and the highly doped deeply diffused regions remained as N+, depleted regions in substrate 20 form beneath the N+ regions. In this case, the depleted regions would join each other because the N+ regions are deeper than the P diffusions, thus causing the channels to disappear and making the isolation resistance equal to the spreading resistance. I have constructed this type of device and have found it to be useless for the purposes of the present invention.

Figure 2:
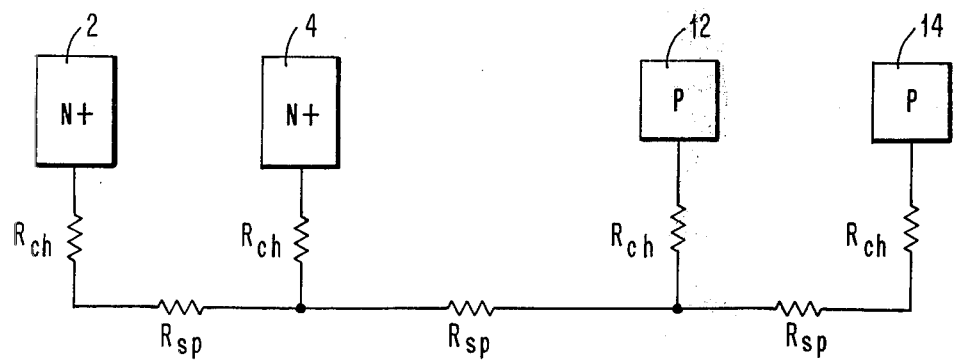
FIG. 2 is an equivalent circuit for the isolation between the N and P pockets of FIG. 1.

The equivalent circuit I have developed for isolation between N and P pockets as shown in FIG. 2, where the SCL current is neglected. In this case the isolation resistance between any two N or P pockets is $$R_{is} = 2R_{ch} + R_{sp} \qquad (4)$$

where $R_{ch}$ is the channel resistance and $R_{sp}$ is the spreading resistance.

The channel resistance is given by the formula:
$$R_{ch} = \rho L/A \qquad (5)$$

where $\rho$ is the resistivity of substrate 20, $L$ is the channel length and $A$ is the cross-sectional area of the channel in the horizontal plane ($\pi r_o^2$).

The spreading resistance is given by the formula:
$$R_{sp} = \rho /2r_o \qquad (6)$$

where $r_o$ is the channel radius shown, by way of example, for regions 2 and 14 in FIG. 1.

Formula (4) is valid only if $dP > r_o$. If dP, for instance, were reduced to $r_o$ ($dP = r_o$), $R_{sp}$ would be reduced by 50 per cent. In this case, if $R_{sp}$ were the dominant term in equation (2), pockets 2 and 4 could not be closer than about $2.r_o$. Because $r_o$ is typically around 0.5 mil, the minimum separation, $dP$, between pockets of like conductivity type would be 1 mil ($25\mu$m). Clearly, high packing densities would be impossible.

On the other hand, $R_{ch}$ is independent of the separation $dP$ as long as channels 29 and 28 do not break down. (Channel breakdown can be prevented, as will be discussed in a later section of the specification.) Moreover, for substrate resistivities of 10KΩ-cm or higher, the $R_{ch}$ term is dominant and is about one order of magnitude or more higher than $R_{sp}$. Thus the $R_{sp}$ term in equation (2) can be neglected and the separation between SCL transistors can be reduced well below 1 mil.

For example, assume that pockets 2 and 4 have an area, A, of $2 \times 10^6$ cm$^2$ ($r_o \; 8 \times 10^{-4}$ cm) and the substrate resistivity, $\rho = 30$K Ω -cm. Then, the depletion region depth, L, is $70 \times 10^{-4}$ cm. Substituting these values into equations (3) and (4): $R_{ch} = 10.5 \times 10^7$ Ω and $R_{sp} = 18.8 \times 10^6$ Ω; and $R_{is} = 22.9 \times 10^7$Ω. Test data on actual devices verify these calculations, with $R_{is}$ having values between 200 and $300 \times 10^6$ Ω.

FIGS. 3A and 3B show a portion of a SCL integrated circuit comprising two NPN transistors, two PNP transistors and two resistors (P and N type), preferably fabricated in the same substrate 51 simultaneously. The two NPN transistors in FIG. 3A comprise emitter regions 50 and 50', base regions 52 and 52' and collector regions 53 and 53', and are isolated by P region 55. N+ region 57 functions as a "dummy" to restrict the lateral area of P region 55 with respect to N+ collector 53 to satisfy equation (2) above. This would be necessary, for example, if a transistor were missing or at the edge of a chip. The two PNP transistors comprise emitter regions 60 and 60', base region 62 and 62' and collector regions 63 and 63', and are isolated by N+ region 65. The P type resistor in FIG. 3B comprises region 66 which is isolated by region 67; the N type resistor comprises region 69 and contact regions 70.

The integrated circuit can be fabricated by conventional diffusion techniques or by ion implantation. Ion implantation is especially attractive for fabricating high value resistors. For this process the resistor region is masked during a blanket P type diffusion 55 and the resistors 69 are implanted separately into high resistivity substrate 51. All integrated circuit components have a common outside P type impurity region 55. The NPN transistors and N type resistor 69 are thus self-isolated. The PNP transistors and P type resistor have to be isolated from outside P region 55 and also from each other by N type isolations 65 (FIG. 3A) and 67 (FIG. 3B). These regions are preferably common to all PNP transistors and P type resistors to increase packing density. In any event, the number of above mentioned circuit elements in each separate N type isolation region should be as large as possible. The separated N type isolation regions can also be connected electrically by metal lines.

The emitter, base and collector regions of the transistors and also regions 67 and 69 of the resistors are connected in standard fashion to metal lines (not shown). These lines serve as electrical interconnections between transistors, resistors and power supplies. The emitter-base junction of each transistor is forward-biased, while the collector-base junction is reverse-biased to perform transistor and circuit operation. In circuit operation, however, the colector-base junction can be periodically forward-biased, and the emitter-base junction reverse-biased. Both the outside P type and N type isolation regions are preferably floating. The former can also be connected to the most negative power supply line and the latter to the most positive power supply line to increase the isolation resistance.

To increase the packing density of the integrated circuit structure shown in FIGS. 3A and 3B, the separation between adjacent devices should be as small as possible. Thus, for example, the distance between N+ collector regions 53 and 53' in FIG. 3A, i.e., the width of isolation P region 55, should be a minimum. However, experimental results and also theoretical considerations demonstrate that isolation channel 55 starts to break down if the distance between 53 and 53' of the two adjacent transistors is closer than about $L_{eff}$ or ½ $L_{DE}$.

Figure 4:
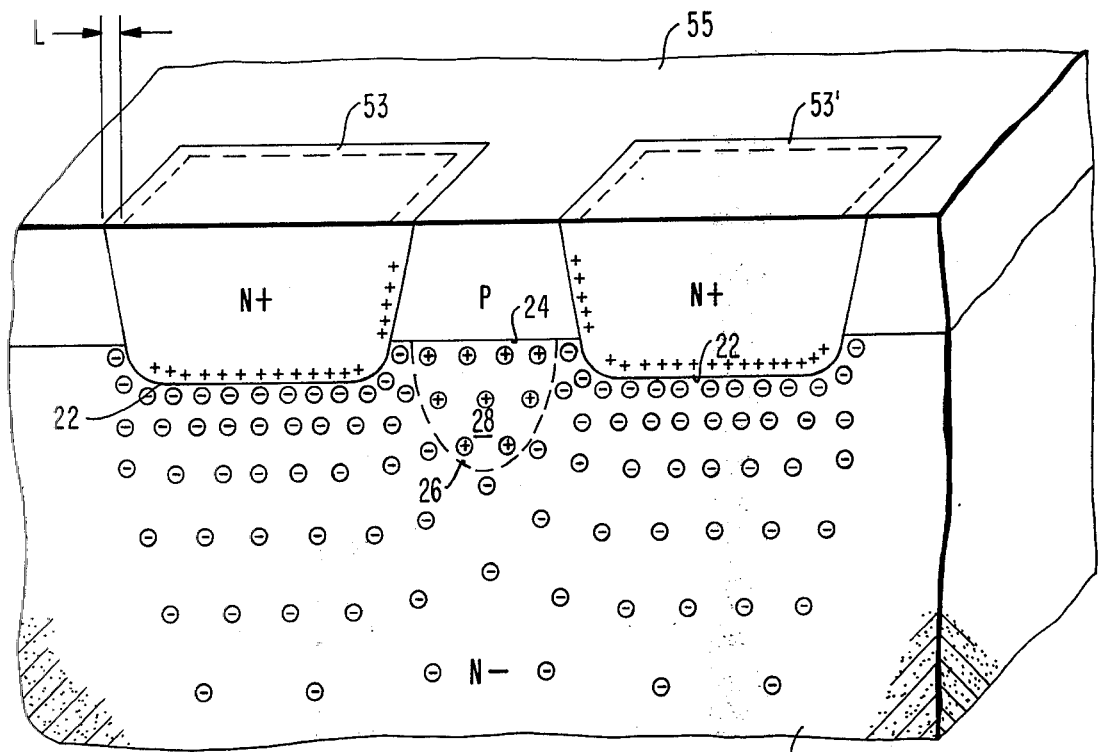
FIG. 4 illustrates the breakdown for adjacent N+ regions if the distance between them is too close.

This breakdown for the two adjacent N+ type collectors 53 and 53' is shown in FIG. 4. The high-low junctions 22 have a tendency to diffuse electrons laterally into the hole-accumulation region 28 below P region 55 from both sides. Those laterally diffused electrons can "pinch off" depletion region 28 and also push back the hole cloud if the separation were smaller than $L_{eff}$ or ½ $L_{DE}$. As a result, the electrical P-N junction 26, formed in substrate 20 by the field of the P-N metallurgical junction 24, is shifted toward its metallurgical junction and the electron clouds tend to join with each other. This could result in a short between the two N+ regions. The value of ½ $L_{DE}$ and hence the minimum separation between adjacent collectors would be about 4.7 $\mu$m for a 30K Ω -cm substrate. These minimum separations also apply for two P type regions separated by an N+ type region, e.g., P regions 60 and 63 and N region 62 which comprise a PNP transistor in FIG. 3A.

One important discovery of the present invention is that the above minimum separation (½ $L_{DE}$) between two N+ regions can be reduced to any extent if the width of the N+ regions is also reduced in such a way to satisfy the formula:
$$dP/dN \geq 0.75 \qquad (7)$$

where $dN$ is the width of the N+ regions and $dP$ is the width of the P region separating the N+ regions.

Preferably:

$$dP/dN \geq 1.0 \tag{8}$$

Figure 5:
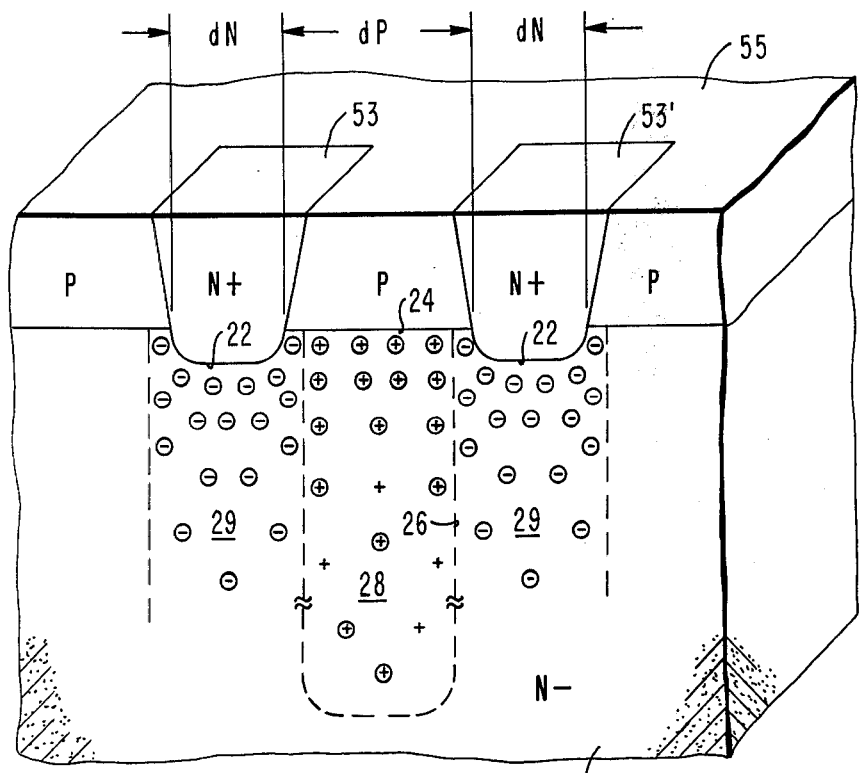
FIG. 5 illustrates the effect of reducing the width of the N+ regions to avoid breakdown.

The effect of the reduction of the width of N+ regions 53 and 53'' is shown in FIG. 5. As can be seen, the density, and thereby $L_{eff}$, for the diffused electron clouds in region 29 is reduced because the widths $dN$ of the high-low junctions 22 are less than $L_{eff}$. Thus, the lateral penetration of the electrons into the hole-accumulated region 28 is minimized.

The minimum separation between two P type regions separated by an N+ type region can also be reduced to any extent if the width of the P type regions is also reduced to satisfy:

$$dN/dP \geq 0.25 \tag{9}$$

$$0.75 < dP/dN < 4 \tag{10}$$

Figure 6:
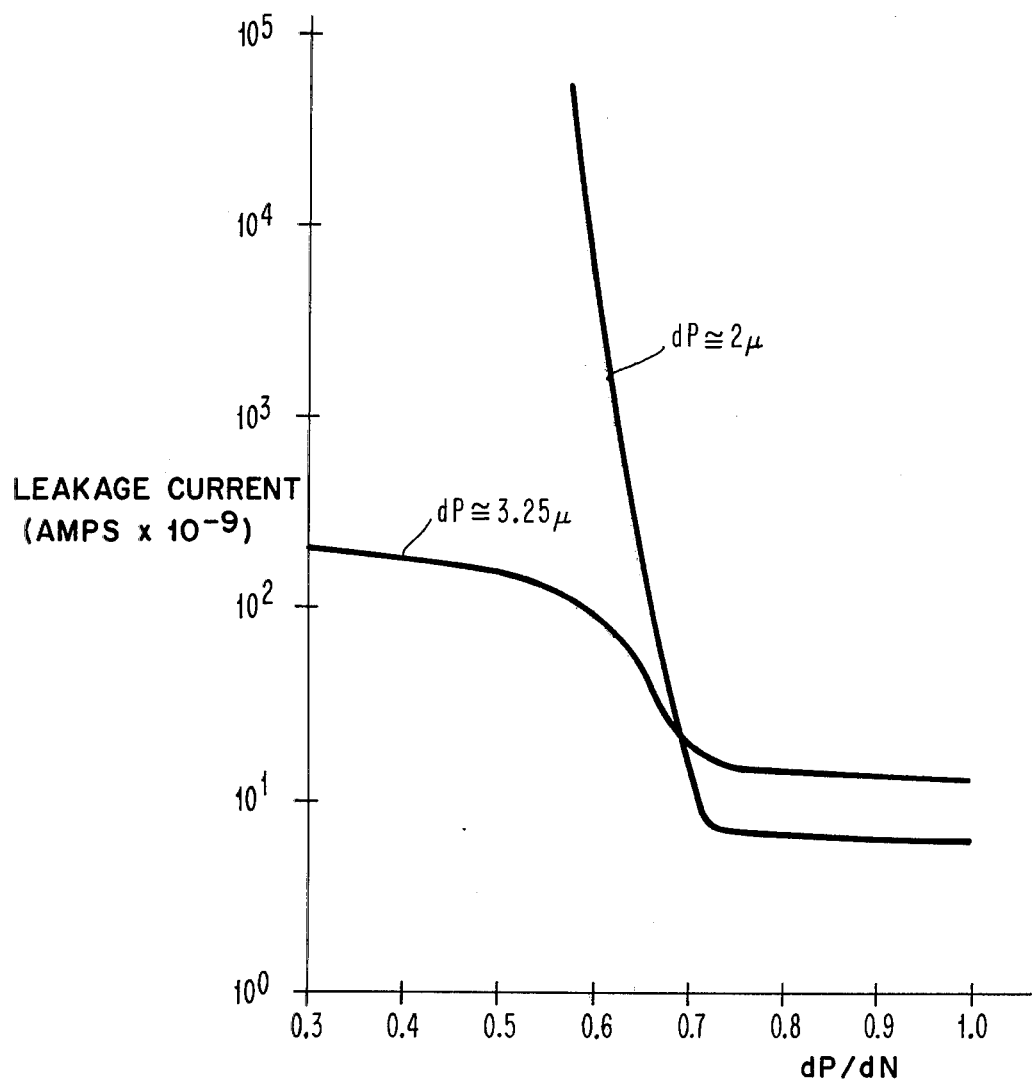
FIG. 6 is a graph of leakage current verses the ratio $dP/dN$ for two values of dP.

Figure 6 is a graph of the leakage current versus the ratio $dP/dN$ for two values of $dP$, both values being less than $L_{eff}$. In both instances, the leakage current is relatively constant if the $dP/dN$ ratio is higher than around 0.75. If, however, the ratio $dP/dN$ goes below around 0.75 the leakage current starts to rise appreciably.

It is also notable that the slope of the graph is much sharper as the width of the regions is made smaller. Thus, in the graph, the slope of the line where $dP = 2$ $\mu$m is much sharper than the slope for the case where $dP = 3.25$ $\mu$m. Results taken with respect to the PNP transistor in the N-substrate of FIG. 1 indicate that the $dN/dP$ ratio can go as low as 0.25 without decreasing the isolation appreciably if the separation between P pockets is less than $L_{eff}$.

The isolation model of the present invention also applies to the emitter-to-collector separation (base width) and base-to-isolation region separation (collector width) of an individual transistor in the integrated circuit. Thus, the emitter, base and collector widths also have to satisfy Equations (7) and (9) in order to minimize emitter-to-collector and base-to-isolation leakage or avoid shorts.

The isolation model applies directly to devices designed with a striped geometry as illustrated in FIGS. 2, 3 and 4 of copending application, Ser. No. 209,233. However, the flux fringing of the electric field at the corners of the emitter of devices having enclosed structures as in FIG. 3 of this application has an important effect because it increases the emitter-to-collector leakage current. Enclosed structures are those in which the collector totally surrounds the emitter area. The flux fringing for the emitter of the enclosed NPN transistor is shown in FIG. 3A. For the sake of clarity, the fringing of the flux line is shown only on the surface of the NPN SCL transistor. In fact, the flux fringing takes place in the high resistivity base region below P-type diffusion 52 if bias is applied between emitter 50 and collector 53. As a result, the potential step in substrate 51 between the emitter and collector is reduced. This, in turn, increases the SCL leakage current between emitter and collector.

Similar flux fringing also occurs below the N-type diffused region (collector) in the high resistivity substrate, increasing the base-to-isolation leakage of the NPN transistor. This latter flux fringing is, however, less pronounced because the large depth of the N-type region. The flux fringing also affects the PNP transistors in the same way.

Figure 7:
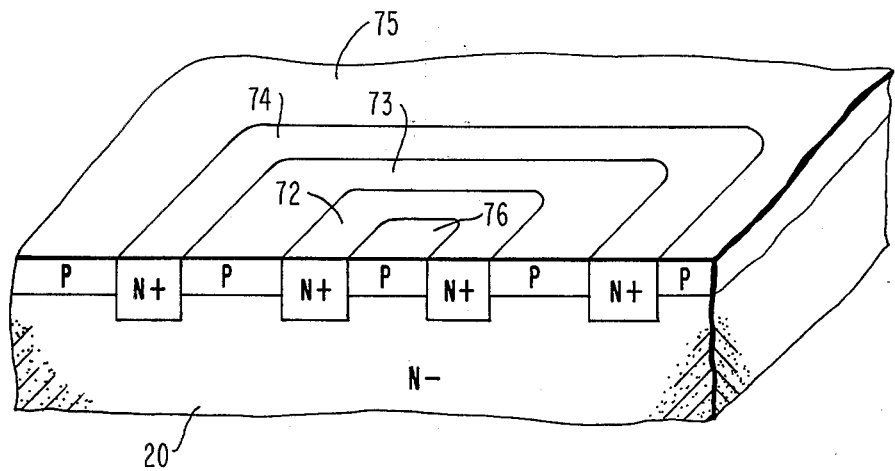
FIG. 7 shows an NPN transistor in accordance with my invention for reducing flux fringing effects.

The preferred technique to reduce the flux fringing effect is to choose a circular geometry or to round up the corners of the active regions. Fig. 7 shows a NPN transistor having a ring-shaped emitter 72 about P region 76 in which the corners of emitter 72, base 73 and collector 74 are rounded. Actual measurements on circular devices of this type indicate a substantial reduction in emitter-to-collector-leakage. For high current drivers, the emitter perimeter of the SCL transistor has to be large, thereby resulting in a large emitter width. To keep the emitter and base width ratio, $dP/dN$, above the critical value of 0.75, the base width has to be increased, which in turn degrades the performance of the SCL transistor. However, providing a ring shaped emitter for high current drivers solves this problem because the emitter perimeter is independent of the emitter width.

In summary, I have established the isolation model for SCL integrated circuits. Close to the surface of the high resistivity substrate, the separated impurity regions of the same conductivity type are isolated with conventional metallurgical junctions. Deep in the substrate, the isolation is achieved with electrical junctions which join the metallurgical junctions in the vertical direction. The electrical junctions form in the substrate between the hole and electron clouds diffused from the P and N type of impurity regions above. The electrical junctions form high resistivity vertical channels of the same conductivity type as the impurity region above. If bias is applied between two separated impurity regions of the same type, the leakage current is confined into those high resistivity channels and spreads out into the high resistivity substrate only at the end of the channel. The channel length is about 70 $\Omega$ for 30K $\Omega$-cm substrate. The resulting isolation resistance is an order or magnitude higher than that resulting from the spreading resistance alone. The typical isolation resistance between two adjacent collectors is 200–300 $\times 10^6$ $\Omega$ for a 30K$\Omega$-cm substrate. The isolation resistance does not decrease appreciably by reducing the separation between the N or P type diffused regions if the ratio $dP/dN$ is kept within 0.75–4.0, where $dP$ and $dN$ are the widths of the P and N+ diffused regions respectively.

While the invention has been particularly shown and described with reference to a preferred embodiment thereof, it will be understood by those skilled in the art that various changes in form and details may be made therein without departing from the spirit and scope of the invention. For example, although my preferred embodiment of the invention is in terms of an enclosed SCL structure, the striped structure described in copending application, Ser. No. 209,233, is also applicable. In addition, SCL transistors having recessed dielectric regions as described in copending application, Ser. No. 428,165, are contemplated. The same isolation model applies, as do the critical lateral widths specified in the equations.

While the invention has been shown and particularly described with reference to preferred structures, it will be understood by those skilled in the art that various changes in form and detail may be made therein without departing from the spirit and scope of the invention.

I claim:

1. An integrated circuit structure comprising:
a high resistivity substrate of at least 10,000 ohm-cm semiconductor material of a first conductivity type;
a plurality of impurity zones of said first conductivity type and a second conductivity type extending from one surface of said substrate to the interior thereof to form at least first and second space-charge-limited transistors of a first conductivity type;

an isolation zone of said second conductivity type separating the collectors of said transistors;

the ratio of the lateral width of said isolation zone to the lateral width of either of said collectors being greater than 0.75;

the emitter and collector of each said transistor being isolated from one another by a base zone of said second conductivity type, the ratio of the lateral width of said base zone to the lateral width of either of said emitter and collector zones being greater than 0.75; and the ratio of the lateral width of said collector to the lateral width of either of said base and isolation zones being greater than 0.25.

2. An integrated circuit structure as in claim 1 wherein at least one of said space-charge-limited transistors comprises an enclosed configuration in which the corners of said collectors are rounded to avoid flux fringing effects.

3. An integrated circuit structure as in claim 2 wherein the emitter of said transistor is configured as a ring.

4. An integrated circuit structure as in claim 1 further comprising another of said second-conductivity-type zones encircled by another zone of said first conductivity type, the former zone functioning as a resistor.

5. An integrated circuit structure comprising:

a high resistivity substrate of at least 10,000 ohm-cm semiconductor material of a first conductivity type;

a plurality of impurity zones of said first conductivity type and a second conductivity type extending from one surface of said substrate to the interior thereof to form at least first and second space-charge-limited transistors of a second conductivity type;

an isolation zone of said first conductivity type separating the collectors of said transistors;

the ratio of the lateral width of said isolation zone to the lateral widths of said collector regions being greater than 0.25;

the emitter and collector of each said transistor being isolated from one another by a base zone of said first conductivity type, the ratio of the lateral width of said base to the lateral width of either of said emitter and collector being greater than 0.25; and the ratio of the lateral width of said collector to the lateral width of either of base and isolation zones being greater than 0.75.

6. An integrated circuit structure as in claim 5 further comprising another of said second conductivity type zones encircled by another zone of said first conductivity type, the former zone functioning as a resistor.

7. An integrated circuit structure comprising:

a high resistivity substrate of at least 10,000 ohm-cm semiconductor material of a first conductivity type;

a plurality of impurity zones of said first conductivity type and a second conductivity type extending from one surface of said substrate to the interior thereof to form first and second space-charge-limited transistors of first and second conductivity type, respectively;

first and second isolation zones of said first and second conductivity type, respectively, separating said transistors, said first isolation zone disposed nearer said transistor of said second conductivity type;

the ratio of the lateral width of said first isolation zone to the width of said second isolation zone and the collector of said second transistor being greater than 0.25;

the ratio of the lateral width of said second isolation zone to the width of said first isolation zone and the collector of said first transistor being greater than 0.75;

the emitter and the collector of said first transistor being isolated from one another by a base zone of said second conductivity type, the ratio of the lateral width of said base zone to the lateral width of either of said emitter and collector zones being greater than 0.75;

the emitter and collector of said second transistor being isolated from one another by a base zone of said first conductivity type, the ratio of the lateral width of said base zone to the lateral width of said emitter and collector zones being greater than 0.25.

8. An integrated circuit structure as in claim 7 wherein said space-charge-limited transistor of said first conductivity type comprises an enclosed configuration in which the corners of said collector is rounded to avoid flux fringing effects.

9. An integrated circuit structure as in claim 8 wherein the emitter of said first transistor is configured as a ring.

10. An integrated circuit structure as in claim 7 further comprising another of said second-conductivity-type zones encircled by another zone of said first conductivity type, the former zone functioning as a resistor.

* * * * *